(12) United States Patent
Hsieh et al.

(10) Patent No.: US 9,529,250 B2
(45) Date of Patent: Dec. 27, 2016

(54) EUV MASK WITH ITO ABSORBER TO SUPPRESS OUT OF BAND RADIATION

(71) Applicant: TAIWAN SEMICONDUCTOR MANUFACTURING COMPANY, LTD., Hsin-Chu (TW)

(72) Inventors: Yi-Ling Hsieh, Kaohsiung (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/529,207

(22) Filed: Oct. 31, 2014

(65) Prior Publication Data

US 2016/0124297 A1    May 5, 2016

(51) Int. Cl.
*G03F 1/24* (2012.01)
*G03F 1/54* (2012.01)
*G03F 7/20* (2006.01)

(52) U.S. Cl.
CPC . *G03F 1/24* (2013.01); *G03F 1/54* (2013.01); *G03F 7/702* (2013.01)

(58) Field of Classification Search
CPC ............... G03F 1/24; G03F 7/702; G03F 1/54
USPC .......................................................... 430/5
See application file for complete search history.

(56) References Cited

U.S. PATENT DOCUMENTS

| | | | |
|---|---|---|---|
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,134,604 B2 * | 9/2015 | Shih et al. | ............... G03F 1/24 |
| 2009/0170011 A1 | 7/2009 | Ahn et al. | |
| 2013/0202992 A1 | 8/2013 | Chen et al. | |
| 2013/0236818 A1 | 9/2013 | Lee | |
| 2014/0218713 A1 | 8/2014 | Lu et al. | |
| 2015/0286146 A1 | 10/2015 | Chang et al. | |
| 2015/0309405 A1 | 10/2015 | Shih et al. | |
| 2015/0311075 A1 | 10/2015 | Huang et al. | |

FOREIGN PATENT DOCUMENTS

| | | |
|---|---|---|
| JP | 2014099642 A | 5/2014 |
| KR | 10-2009-0070025 | 7/2009 |
| KR | 10-2013-0102903 | 9/2013 |
| KR | 10-2014-0099163 | 8/2014 |
| TW | 201435481 A | 9/2014 |

OTHER PUBLICATIONS

Office Action with translation in corresponding Korean Patent Application No. 10-2014-0193552, dated Apr. 5, 2016, 12 pages.
Hee Young Kang and Chang Kwon Hwangbo, "Absorber Stack with Transparent Conductive Oxide Layer for Extreme Ultraviolet Lithography," Journal of Vacuum Science & Technology B, Jan. 12, 2009, pp. 57-60, J. Vac. Sci. Technol. B 27(1), Jan./Feb. 2009, American Vacuum Society.
Ryuji Onishi, Rikimaru Sakamoto, Noriaki Fujitani, Takafumi Endo, Bang-Ching Ho, "The Novel Top-Coat Material for RLS Trade-Off Reduction in EUVL,"Proc. of SPIE vol. 8322, 83222D (2012), pp. 83222D1-83222D6, vol. 8322 83222D-1, Extreme Ultraviolet (EUV) Lithography III.

\* cited by examiner

*Primary Examiner* — Christopher Young
(74) *Attorney, Agent, or Firm* — Haynes and Boone, LLP

(57) ABSTRACT

The present disclosure also provides a photolithography mask. The photolithography mask includes a substrate that contains a low thermal expansion material (LTEM). A reflective structure is disposed over the substrate. A capping layer is disposed over the reflective structure. An absorber layer is disposed over the capping layer. The absorber layer contains an indium tin oxide (ITO) material. In some embodiments, the ITO material has a $SnO_6$ crystalline structure.

12 Claims, 5 Drawing Sheets

EUV MASK WITH ITO ABSORBER TO SUPPRESS OUT OF BAND RADIATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask. Currently, binary intensity masks (BIM) are employed in EUVL for fabricating integrated circuits. EUVL is similar to optical lithography in that it needs a mask to print wafers, except that it employs light in the EUV region, i.e., at 13.5 nm. At the wavelength of 13.5 nm or so, all materials are highly absorbing. Thus, reflective optics rather than refractive optics is used. A multi-layered (ML) structure is used as a EUV mask blank.

However, conventional EVU masks and the fabrication thereof may still have drawbacks. For example, conventional EUV masks may not be able to effectively mitigate out of band (OOB) radiation, which leads to lithography performance degradations such as image contrast loss.

Therefore, while EUV lithography systems and processes have been generally adequate for their intended purposes, they have not been entirely satisfactory in every aspect. What is needed is a EUV lithography method system to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
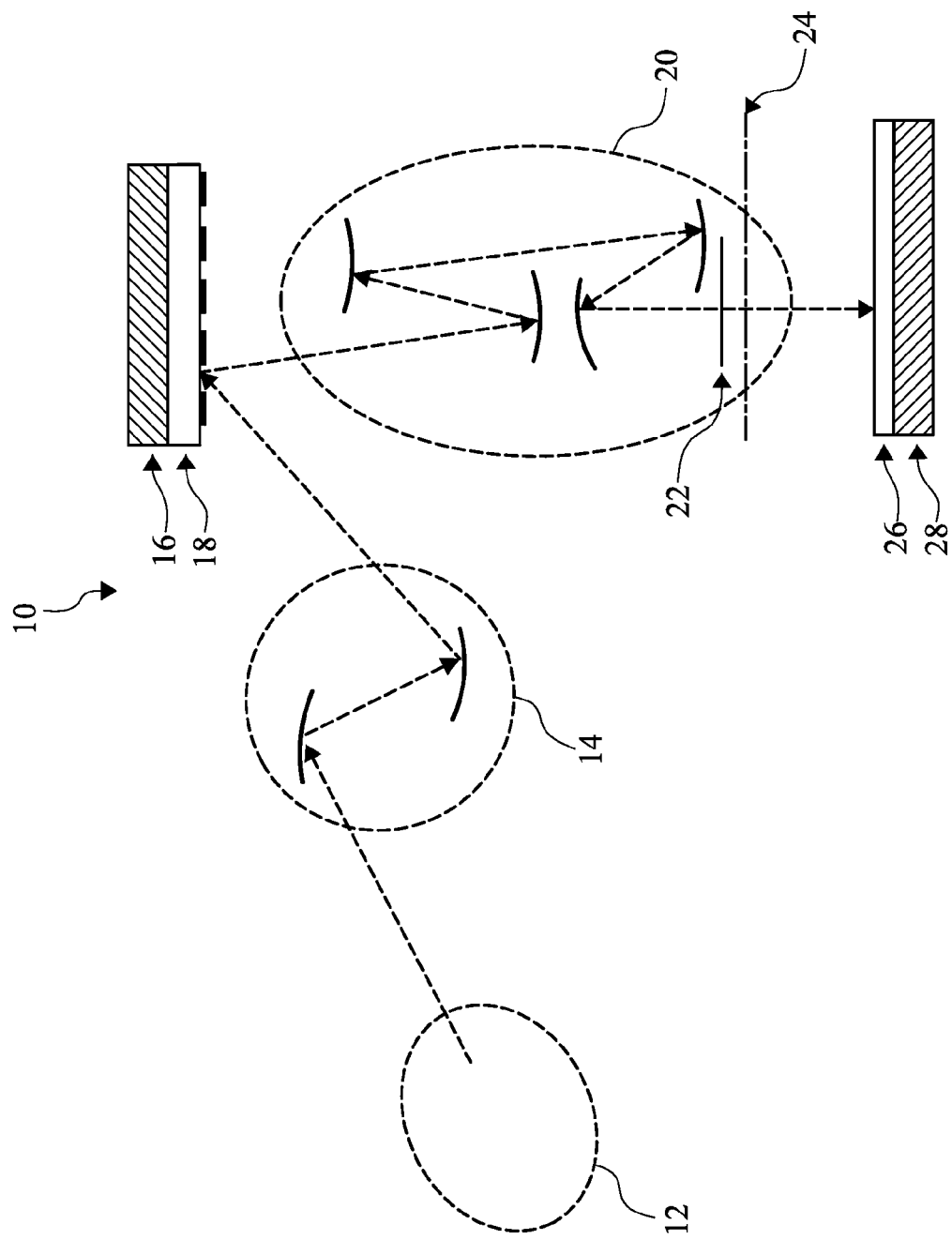
FIG. 1 is a schematic view of a lithography system constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme-ultraviolet (EUV) lithography is a promising patterning technology as semiconductor device sizes continue to shrink. Yet despite many of its advantages, conventional EUV lithography may still have certain drawbacks. For example, unlike conventional optical lithography techniques in which the exposure light source is of very narrow bandwidth and their flare comes from the same wavelength with a large area, EUV exposure light source may contains considerable out of band (OOB) radiation. OOB radiation may be caused by tin plasma (used to produce EUV light) both in discharge-produced plasma (DPP) and laser-produced plasma (LPP). The reflectivity of multilayer optics at a target wavelength of 13.5 nanometers (nm) is comparable to that of their reflectivity in the deep ultraviolet (DUV) and ultraviolet (UV) regions from 100 nm to 350 nm. A part of the OOB radiation can also arrive at the wafer and cause image contrast loss. To improve image contrast, the present disclosure offers an EUV mask with a novel structure that can is configured to suppress OOB radiation, as discussed in more detail below.

FIG. 1 is a schematic view diagram of a lithography system 10, constructed in accordance with some embodiments. The lithography system 10 may also be generically referred to as a scanner that is operable to perform lithography exposing processes with respective radiation source and exposure mode. In the present embodiment, the lithography system 10 is an extreme ultraviolet (EUV) lithography system designed to expose a resist layer by EUV light. The resist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates an EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is an EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC), the absorber layer is discussed below in greater detail according to various aspects of the present disclosure. Alternatively, another reflective layer may be deposited over the ML and is patterned to define a layer of an integrated circuit, thereby forming an EUV phase shift mask.

The lithography system 10 also includes a projection optics module (or projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, carrying the image of the pattern defined on the mask, is collected by the POB 20. The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as a EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by depositing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
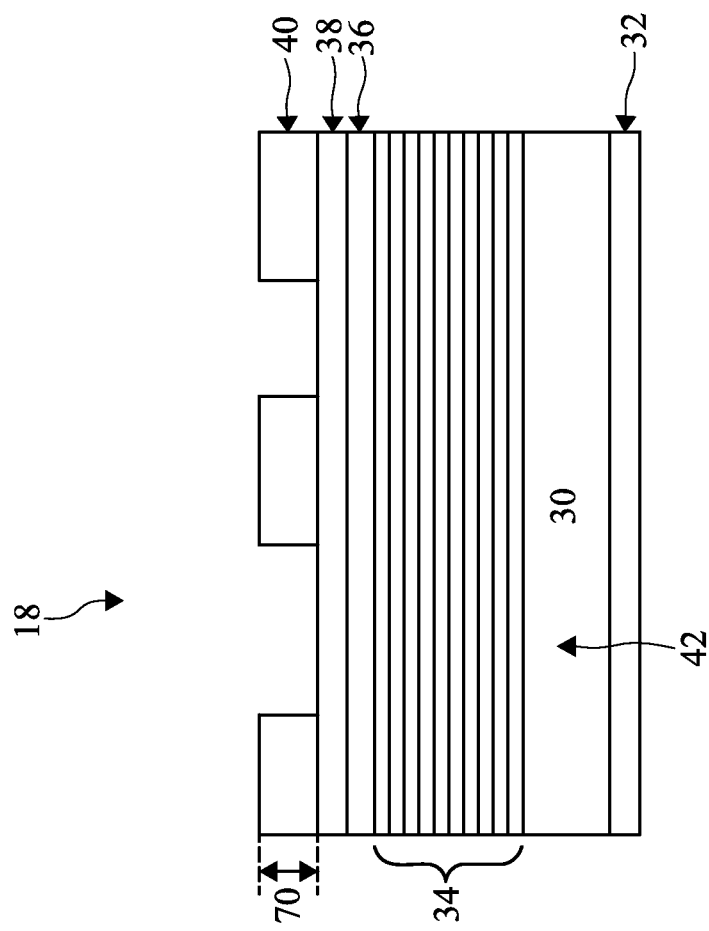
FIG. 2 is a sectional view of an EUV mask constructed in accordance with some embodiments.

One example of the mask 18 is shown in FIG. 2. The mask 18 is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN), though other suitable compositions are possible.

The EUV mask 18 includes a reflective multilayer (ML) 34 disposed over the LTEM substrate 30. The ML 34 may be selected such that it provides a high reflectivity to a selected radiation type/wavelength. The ML 34 includes a plurality of film pairs, such as Mo/Si film pairs (e.g., a layer of molybdenum above or below a layer of silicon in each film pair). Alternatively, the ML 34 may include Mo/Be film pairs, or any materials with refractive index difference being highly reflective at EUV wavelengths. The thickness of each layer of the ML 34 depends on the EUV wavelength and the incident angle. Particularly, the thickness of the ML 34 (and the thicknesses of the film pairs) is adjusted to achieve a maximum constructive interference of the EUV light diffracted at each interface and a minimum absorption of the EUV light by the ML 34.

The EUV mask 18 also includes a capping layer 36 disposed over the ML 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In conventional EUV masks, the absorber layer is typically made of tantalum boron nitride (TaBN), tantalum boron oxide (TaBO), or chromium (Cr). However, these conventional absorber layer materials do not effectively suppress the undesirable OOB radiation discussed above.

According to the various embodiments of the present disclosure, the absorber layer 40 of the EUV mask 18 is configured to have a material that helps suppress OOB radiation. In more detail, rather than using TaBN, TaBO, or Cr, the absorber layer 40 of the present disclosure uses indium tin oxide (ITO). In some embodiments, the indium-oxygen (In—O) bonding percentage is between about 20% to about 50%. This bonding range helps the ITO material in the absorber layer 40 suppress OOB radiation.

Figure 3:
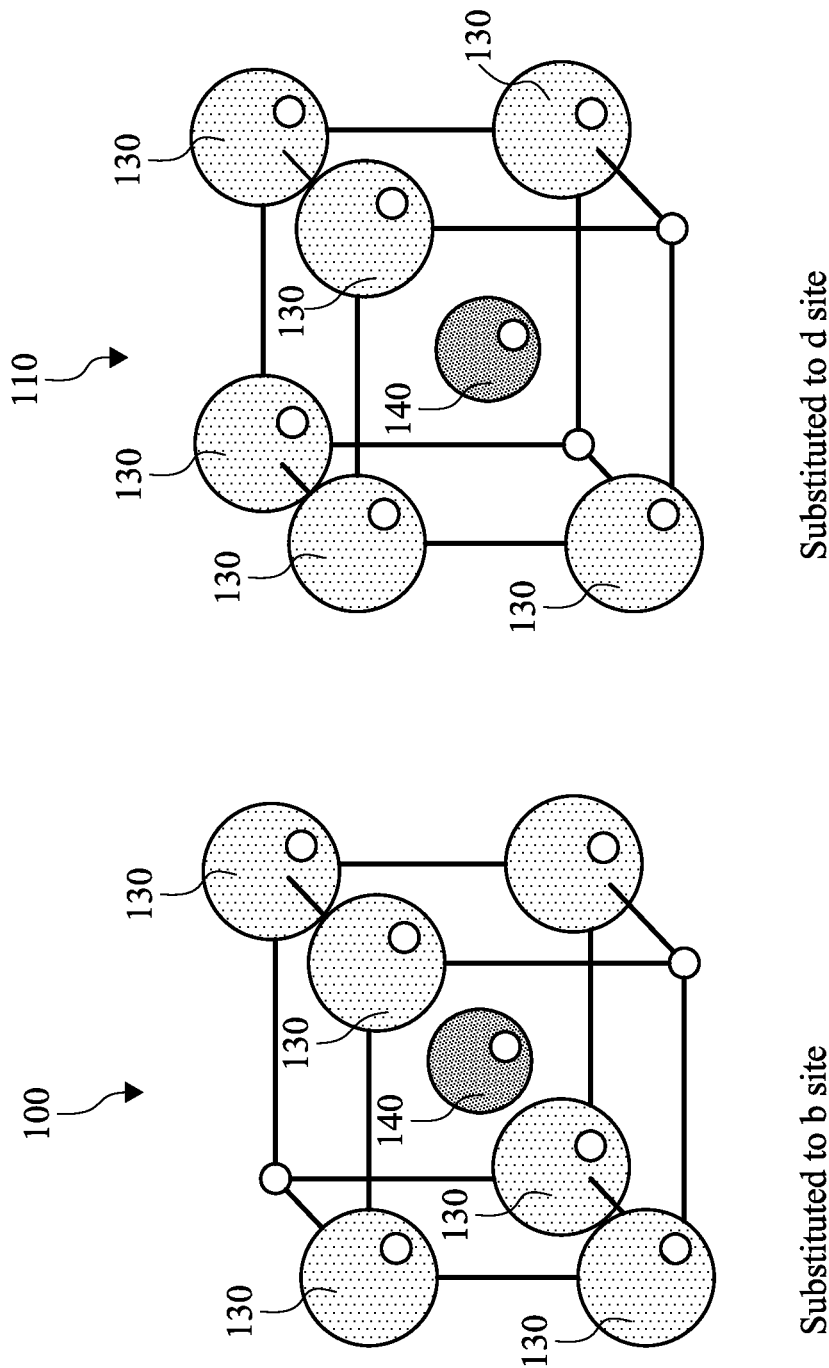
FIG. 3 is a view of a portion of a $SnO_6$ crystalline structure used to implement an absorber layer of the EUV mask in accordance with some embodiments.

In some embodiments, the ITO material used for the absorber layer 40 is also configured to have a $SnO_6$ crystalline structure. For example, FIG. 3 illustrates two example embodiment $SnO_6$ crystalline structures 100 and 110. The $SnO_6$ crystalline structures 100 and 110 each include six oxygen atoms 130 and a tin atom 140. In the $SnO_6$ crystalline structure 100, the tin atom 140 is substituted to the b site. In the $SnO_6$ crystalline structure 110, the tin atom 140 is substituted to the d site.

The ITO material with the $SnO_6$ crystalline structure helps reduce the effect of OOB radiation. For example, the ITO material with the $SnO_6$ crystalline structure is configured to have a carefully-tuned refractive index value and a carefully-tuned extinction coefficient value. In some embodiments, the refractive index of the ITO material is in a range from about 1 to about 2.5, and the extinction coefficient of the ITO material is in a range from about 0.4 to about 0.8. These optimized values for the refractive index and the extinction coefficient may be achieved by controlling/adjusting the deposition parameters of a deposition process used to form the absorber layer 40, as discussed in more detail below.

The ITO material with the $SnO_6$ crystalline structure is also configured to have an optimized content or concentration for each of the indium, tin, and oxygen. In some embodiments, the ITO material has an oxygen content between about 30% and about 65%, an indium content between about 30% and about 65%, and a tin content less than about 3%. In certain embodiments, the oxygen content of the ITO material is between about 45% and about 50%, the indium content of the ITO material is between about 45% and about 55%, and the tin content of the ITO material is between about 1% and about 3%.

According to one particular embodiment, the ITO material with the $SnO_6$ crystalline structure is $In_{0.5}Sn_{0.03}O_{0.47}$. For a 193 nm laser, the $In_{0.5}Sn_{0.03}O_{0.47}$ has a refractive index value of 1.174, an extinction coefficient value of 0.477, with a reflection of 1.07%. For a 248 nm laser, the $In_{0.5}Sn_{0.03}O_{0.47}$ has a refractive index value of 1.213, an extinction coefficient value of 0.468, with a reflection of 1.96%.

According to another particular embodiment, the ITO material with the $SnO_6$ crystalline structure is $In_{0.52}Sn_{0.02}O_{0.46}$. For a 193 nm laser, the $In_{0.52}Sn_{0.02}O_{0.46}$ has a refractive index value of 1.810, an extinction coefficient value of 0.798, with a reflection of 17.42%. For a 248 nm laser, the $In_{0.52}Sn_{0.02}O_{0.46}$ has a refractive index value of 1.892, an extinction coefficient value of 0.757, with a reflection of 16.00%.

According to yet another particular embodiment, the ITO material with the $SnO_6$ crystalline structure is $In_{0.5}Sn_{0.02}O_{0.48}$. For a 193 nm laser, the $In_{0.5}Sn_{0.02}O_{0.48}$ has a refractive index value of 1.464, an extinction coefficient value of 0.602, with a reflection of 9.03%. For a 248 nm laser, the $In_{0.5}Sn_{0.02}O_{0.48}$ has a refractive index value of 1.517, an extinction coefficient value of 0.437, with a reflection of 2.55%.

According to yet another particular embodiment, the ITO material with the $SnO_6$ crystalline structure is $In_{0.5}Sn_{0.02}O_{0.48}$. For a 193 nm laser, the $In_{0.5}Sn_{0.02}O_{0.48}$ has a refractive index value of 2.108, an extinction coefficient value of 0.591, with a reflection of 18.21%. For a 248 nm laser, the $In_{0.5}Sn_{0.02}O_{0.48}$ has a refractive index value of 2.303, an extinction coefficient value of 0.434, with a reflection of 29.66%.

As discussed above, these ITO materials with specifically-configured ratios of indium, tin, and oxygen and also the specific refractive index and extinction coefficient values allow the OOB radiation to be substantially suppressed, for example by reducing the reflection of the OOB radiation as the OOB radiation (along with the EUV radiation) is reflected from the absorber layer 40. The mitigation of the negative impacts of OOB radiation by the ITO absorber layer 40 allows the absorber layer 40 to have a smaller height 70 compared to absorber layers in conventional EUV masks. In some embodiments, the height 70 of the absorber layer 40 is in a range from about 25 nm to about 55 nm, whereas a height of an absorber layer in a conventional EUV mask is typically greater than at least 70 nm. The smaller height 70 of the absorber layer 40 reduces undesirable geometric shadow effects, which in turn improves EUV lithography performance. The suppression of OOB radiation also broadens critical dimension (CD) process window.

Figure 4:
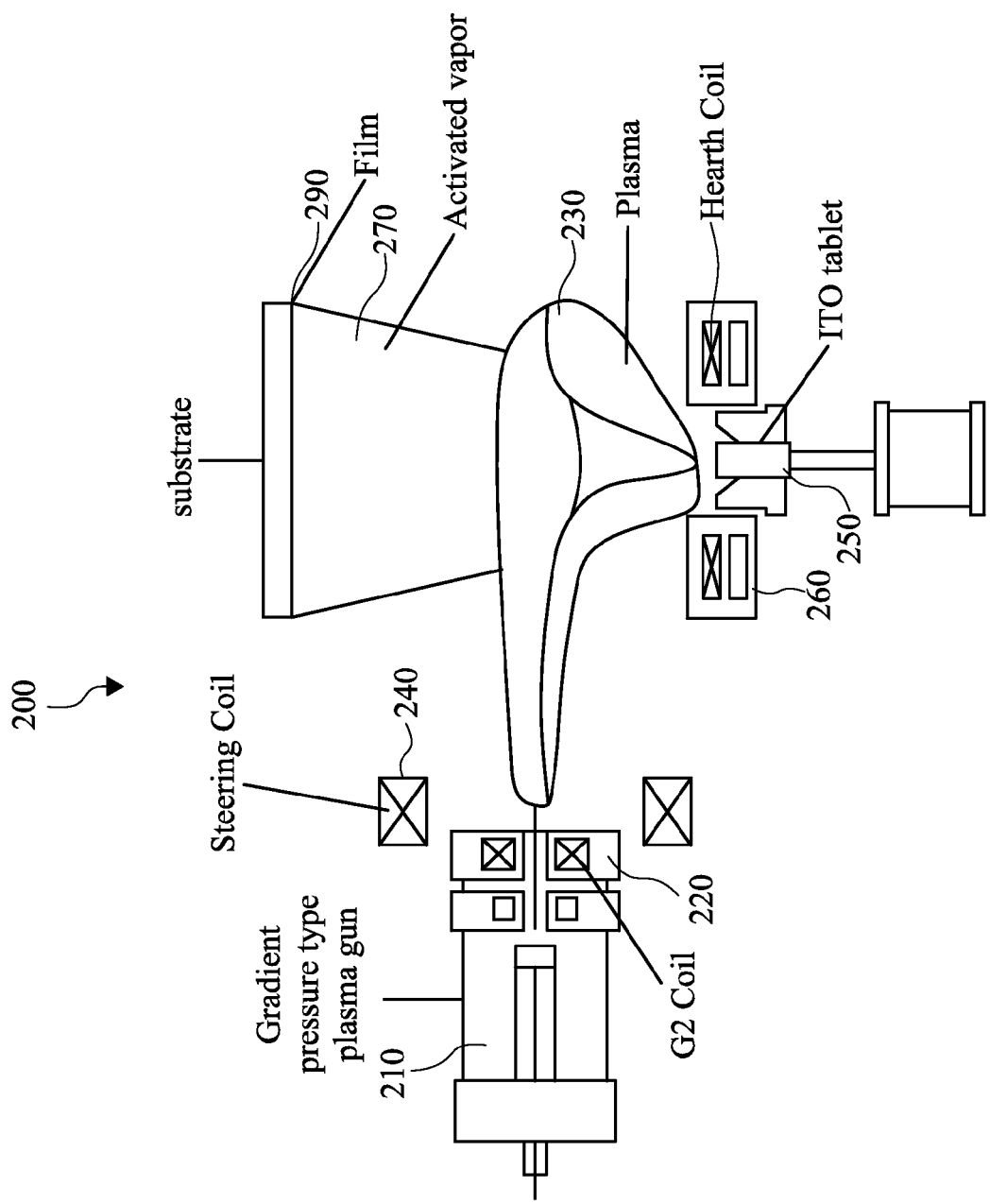
FIG. 4 is a view of a reactive plasma deposition system used to form the absorber layer of the EUV mask in accordance with some embodiments.

FIG. 4 is a simplified view of a reactive plasma deposition tool 200. The reactive plasma deposition tool 200 is used to form the absorber layer 40 discussed above. The plasma deposition tool 200 includes a plasma gun 210 with coils 220 to generate plasma 230. The plasma deposition tool 200 include steering coil 240 to steer the generation of the plasma 230. An ITO tablet 250 is heated by hearth coil 260 to provide the ITO source material. The combination of the plasma 230 and the ITO material produces activated vapor 270. A substrate 280, for example an EUV mask, is positioned so that the activated vapor 270 deposits a film 290 on the surface of the substrate 280, thereby forming the ITO-containing absorber layer.

Figure 5:
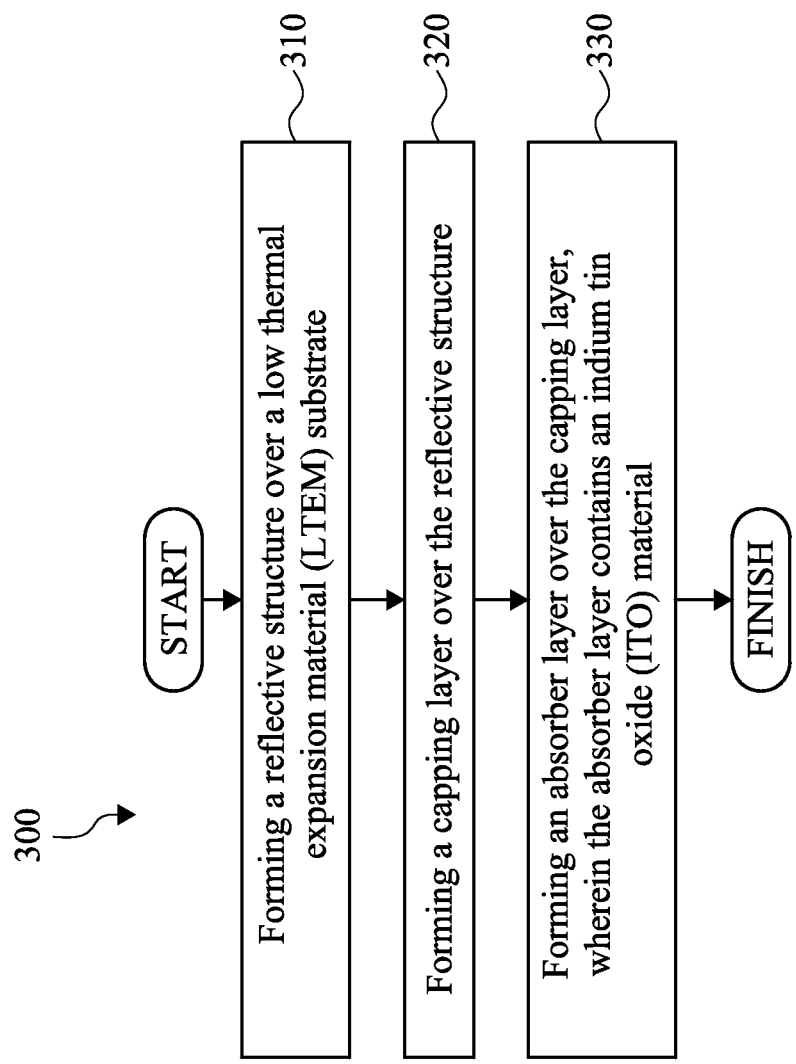
FIG. 5 is a flowchart of a method of fabricating an EUV mask in accordance with some embodiments.

FIG. 5 is a simplified flowchart illustrating a method 300 of fabricating a lithography mask according to an embodiment of the present disclosure. In some embodiments, the lithography mask is an EUV mask. The method 300 includes a step 310 of forming a reflective structure over a low thermal expansion material (LTEM) substrate. In some embodiments, the LTEM substrate contains $TiO_2$ doped $SiO_2$. The reflective structure is configured to provide high reflectivity to a predefined radiation wavelength, for example a wavelength in the EUV range. In some embodiments, the reflective structure includes a plurality of Mo/Si film pairs or a plurality of Mo/Be film pairs.

The method 300 includes a step 320 of forming a capping layer over the reflective structure. In some embodiments, the capping layer contains silicon.

The method 300 includes a step 330 of forming an absorber layer over the capping layer. The absorber layer contains an indium tin oxide (ITO) material. In some embodiments, the step 330 of forming the absorber lays comprises performing a reactive plasma deposition process. The plasma deposition process is performed with the following process parameters:
 a. a deposition temperature from about 180 degrees Celsius and about 250 degrees Celsius;
 b. a deposition flow rate from about 120 standard cubic centimeters per minute (sccm) to about 180 sccm for argon, and a deposition flow from about 0 sccm to about 12 sccm for oxygen;
 c. a deposition rate from about 1 angstroms per second to about 10 angstroms per second; and
 d. a chamber pressure that is within +20% or −20% of $10^{-2}$ pascal.

In some embodiments, the step 330 of forming the absorber layer is performed such that the ITO material has a $SnO_6$ crystalline structure. The $SnO_6$ crystalline structure may have example embodiments shown in FIG. 3 of the drawings.

In some embodiments, the step 330 of forming the absorber layer is performed such that the ITO material has: a refractive index that is in a range from about 1 to about 2.5; an extinction coefficient that is in a range from about 0.4 to about 0.8; and a height from about 25 nanometers (nm) to about 55 nm.

In some embodiments, the step 330 of forming the absorber layer is performed such that: the ITO material has an oxygen content between about 45% and about 50%; the ITO material has an indium content between about 45% and about 55%; and the ITO material has a tin content between about 1% and about 3%.

It is understood that additional steps may be performed before, during, or after the steps 310-330 shown herein. For example, the method 300 may include a step of forming a buffer layer between the capping layer and the absorber layer. The buffer layer and the absorber layer have different etching characteristics. Additional steps are not specifically discussed herein for reasons of simplicity.

Based on the above discussions, it can be seen that the present disclosure offers various advantages in EUV lithography. It is understood, however, that not all advantages are necessarily discussed herein, and other embodiments may offer different advantages, and that no particular advantage is required for all embodiments.

One of the advantages is that the absorber layer of the EUV mask has a ITO material that is specifically configured to mitigate the negative impacts of OOB radiation. As a result, EUV lithography performance is improved. For example, image contrast is enhanced. As another example, the suppression of OOB radiation allows the absorber layer height to be smaller, which may in turn reduce undesirable geometric shadow effects. In addition, the suppression of OOB radiation also broadens critical dimension process window. The EUV mask with the ITO absorber layer discussed herein is also easy to manufacture and is compatible with existing process flow.

The present disclosure provides for a photolithography mask in accordance with some embodiments. The photolithography mask includes a substrate that contains a low thermal expansion material (LTEM). The photolithography mask also includes a reflective structure disposed over the substrate. The photolithography mask further includes a capping layer disposed over the reflective structure. The photolithography mask also includes an absorber layer disposed over the capping layer. The absorber layer contains an indium tin oxide (ITO) material.

The present disclosure provides for a photolithography system in accordance with some embodiments. The photolithography system includes a radiation source configured to generate extreme ultraviolet (EUV) radiation. The photolithography system also includes an EUV mask. The EUV mask includes an absorber layer that contains an indium tin oxide (ITO) material. The photolithography system further includes an illuminator that includes one or more refractive or reflective optical components. The illuminator is configured to direct the EUV radiation onto the EUV mask.

The present disclosure provides for a method of fabricating a photolithography mask in accordance with some embodiments. A reflective structure is formed over a low thermal expansion material (LTEM) substrate. A capping layer is formed over the reflective structure. An absorber layer is formed over the capping layer. The absorber layer contains an indium tin oxide (ITO) material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography mask, comprising:
   a substrate that contains a low thermal expansion material (LTEM);
   a reflective structure disposed over the substrate;
   a capping layer disposed over the reflective structure; and
   an absorber layer disposed over the capping layer, wherein the absorber layer contains an indium tin oxide (ITO) material, and wherein the ITO material has a $SnO_6$ crystalline structure.

2. The photolithography mask of claim 1, wherein the ITO material has:
   a refractive index that is in a range from 1 to 2.5; and
   an extinction coefficient that is in a range from 0.4 to 0.8.

3. The photolithography mask of claim 1, wherein:
   the ITO material has an oxygen content between 30% and 65%;
   the ITO material has an indium content between 30% and 65%; and
   the ITO material has a tin content less than 3%.

4. The photolithography mask of claim 3, wherein:
   the oxygen content of the ITO material is between 45% and 50%;
   the indium content of the ITO material is between 45% and 55%; and
   the tin content of the ITO material is between 1% and 3%.

5. The photolithography mask of claim 1, wherein an In—O bonding percentage of the ITO material is between 20% and 50%.

6. The photolithography mask of claim 1, wherein a height of the absorber layer is from 25 nanometers (nm) to 55 nm.

7. The photolithography mask of claim 1, further comprising a buffer layer between the capping layer and the absorber layer.

8. A method of fabricating a photolithography mask, comprising:
   forming a reflective structure over a low thermal expansion material (LTEM) substrate;
   forming a capping layer over the reflective structure; and
   forming an absorber layer over the capping layer, wherein the absorber layer contains an indium tin oxide (no) material, wherein the forming of the absorber layer comprises performing a reactive plasma deposition process, the reactive plasma deposition process having:
      a deposition temperature from 180 degrees Celsius and 250 degrees Celsius;
      a deposition flow rate from 120 standard cubic centimeters per minute (sccm) to 180 sccm for argon, and a deposition flow from 0 sccm to 12 sccm for oxygen;
      a deposition rate from 1 angstroms per second to 10 angstroms per second; and
      a chamber pressure that is within +20% or −20% of $10^{-2}$ pascal.

9. The method of claim 8, wherein the forming of the absorber layer is performed such that the ITO material has a $SnO_6$ crystalline structure.

10. The method of claim 8, wherein the forming of the absorber layer is performed such that the ITO material has:
    a refractive index that is in a range from 1 to 2.5;
    an extinction coefficient that is in a range from 0.4 to 0.8; and
    a height from 25 nanometers (nm) to 55 nm.

11. The method of claim 8, wherein the forming of the absorber layer is performed such that:
    the ITO material has an oxygen content between 45% and 50%;
    the ITO material has an indium content between 45% and 55%; and
    the ITO material has a tin content between 1% and 3%.

12. The method of claim 8, wherein the ITO material is formed to have a $SnO_6$ crystalline structure.

* * * * *